(12) United States Patent
Quinn

(10) Patent No.: US 7,994,610 B1
(45) Date of Patent: Aug. 9, 2011

(54) INTEGRATED CAPACITOR WITH TARTAN CROSS SECTION

(75) Inventor: Patrick J. Quinn, Dublin (IE)

(73) Assignee: Xilinx, Inc., San Jose, CA (US)

( * ) Notice: Subject to any disclaimer, the term of this patent is extended or adjusted under 35 U.S.C. 154(b) by 270 days.

(21) Appl. No.: 12/276,291

(22) Filed: Nov. 21, 2008

(51) Int. Cl.
*H01L 21/02* (2006.01)

(52) U.S. Cl. ............ 257/532; 257/534; 257/E27.048

(58) Field of Classification Search .......... 257/307, 257/308, 532, E27.048, E21.008, 534; 361/306.1, 361/306.3; 438/396
See application file for complete search history.

(56) References Cited

U.S. PATENT DOCUMENTS

| | | |
|---|---|---|
| 1,899,176 A | 2/1933 | Bailey |
| 3,593,319 A | 7/1971 | Barber |
| 4,156,249 A | 5/1979 | Koo |
| 4,249,196 A | 2/1981 | Durney et al. |
| 4,409,608 A | 10/1983 | Yoder |
| 4,427,457 A | 1/1984 | Carlson et al. |
| 4,470,096 A | 9/1984 | Guertin |
| 4,470,099 A | 9/1984 | Sawairi |
| 4,571,543 A | 2/1986 | Raymond et al. |
| 4,639,686 A | 1/1987 | Beckenbach et al. |
| 4,700,457 A | 10/1987 | Matsukawa |
| 4,731,696 A | 3/1988 | Himes et al. |
| 4,827,323 A | 5/1989 | Tigelaar et al. |
| 4,831,431 A | 5/1989 | Hanlon |
| 4,878,151 A | 10/1989 | Gallichio |
| 4,914,546 A | 4/1990 | Alter |
| 4,937,649 A | 6/1990 | Shiba et al. |
| 4,994,688 A | 2/1991 | Horiguchi et al. |
| 5,005,103 A | 4/1991 | Kwon et al. |
| 5,021,920 A | 6/1991 | Smith |
| 5,077,225 A | 12/1991 | Lee |

(Continued)

FOREIGN PATENT DOCUMENTS

DE 25 48 563 A1 5/1977

(Continued)

OTHER PUBLICATIONS

Fukuda, H. et al. "Enumeration of Polyominoes, Polyiamonds and Polyhexes for Isohedral Tilings with Rotational Symmetry", Jun. 11, 2007, Computational Geometry and Graph Theory, Springer Berlin Heidelberg, Berlin Heidelberg, pp. 68-78.

(Continued)

*Primary Examiner* — Thao X Le
*Assistant Examiner* — Robert Huber
(74) *Attorney, Agent, or Firm* — Scott Hewett; John J. King

(57) ABSTRACT

A capacitor in an IC has a first layer of conductive strips extending along a first direction (Z-direction). A first plurality of conductive strips in the first layer forms a portion a first node of the capacitor and alternates with a second plurality of conductive strips forming a portion of a second node of the capacitor. A plate layer adjacent to the first layer has a third plurality of conductive strips forming a portion the first node. Each strip in the third plurality of conductive strips is adjacent to another strip forming a part of the first node. The strips in the plate layer extend along a second direction (X-direction) orthogonal to the first direction. A first via electrically connects a first conductive strip in the first plurality of conductive strips in the first layer to a second conductive strip in the plate layer.

20 Claims, 4 Drawing Sheets

U.S. PATENT DOCUMENTS

| | | | |
|---|---|---|---|
| 5,083,184 A | 1/1992 | Eguchi | |
| 5,089,878 A | 2/1992 | Lee | |
| 5,117,114 A | 5/1992 | Street et al. | |
| 5,119,169 A | 6/1992 | Kozono et al. | |
| 5,142,639 A | 8/1992 | Kohyama et al. | |
| 5,155,658 A | 10/1992 | Inam et al. | |
| 5,166,858 A | 11/1992 | Frake et al. | |
| 5,172,299 A | 12/1992 | Yamada et al. | |
| 5,177,410 A | 1/1993 | Hashiguchi et al. | |
| 5,189,594 A | 2/1993 | Hoshiba | |
| 5,208,725 A | 5/1993 | Akcasu | |
| 5,275,974 A | 1/1994 | Ellul et al. | |
| 5,583,359 A | 12/1996 | Ng et al. | |
| 5,712,813 A | 1/1998 | Zhang | |
| 5,868,388 A | 2/1999 | Wood et al. | |
| 5,939,766 A | 8/1999 | Stolmeijer et al. | |
| 6,037,621 A | 3/2000 | Wilson | |
| 6,064,108 A | 5/2000 | Martinez | |
| 6,066,537 A * | 5/2000 | Poh | 438/393 |
| 6,297,524 B1 | 10/2001 | Vathulya et al. | |
| 6,303,456 B1 | 10/2001 | Pricer et al. | |
| 6,303,457 B1 | 10/2001 | Christensen et al. | |
| 6,383,858 B1 | 5/2002 | Gupta et al. | |
| 6,385,033 B1 | 5/2002 | Javanifard et al. | |
| 6,410,954 B1 | 6/2002 | Sowlati et al. | |
| 6,417,556 B1 | 7/2002 | Long et al. | |
| 6,542,351 B1 | 4/2003 | Kwang | |
| 6,570,210 B1 | 5/2003 | Sowlati et al. | |
| 6,597,562 B1 | 7/2003 | Hu et al. | |
| 6,625,006 B1 | 9/2003 | Aram et al. | |
| 6,653,681 B2 | 11/2003 | Appel | |
| 6,661,079 B1 | 12/2003 | Bikulcius | |
| 6,690,570 B2 | 2/2004 | Hajimiri et al. | |
| 6,737,698 B1 | 5/2004 | Paul et al. | |
| 6,747,307 B1 | 6/2004 | Vathulya et al. | |
| 6,765,778 B1 | 7/2004 | Du et al. | |
| 6,819,542 B2 | 11/2004 | Tsai et al. | |
| 6,822,312 B2 | 11/2004 | Sowlati et al. | |
| 6,880,134 B2 | 4/2005 | Drennan | |
| 6,882,015 B2 | 4/2005 | Bernstein et al. | |
| 6,897,505 B2 | 5/2005 | Aton | |
| 6,903,918 B1 | 6/2005 | Brennan | |
| 6,927,125 B2 | 8/2005 | Jones et al. | |
| 6,933,551 B1 | 8/2005 | Stribley et al. | |
| 6,949,781 B2 | 9/2005 | Chang et al. | |
| 6,963,122 B1 | 11/2005 | Soenen et al. | |
| 6,974,744 B1 | 12/2005 | Aram et al. | |
| 7,009,832 B1 | 3/2006 | Chen et al. | |
| 7,013,436 B1 | 3/2006 | Morton et al. | |
| 7,027,287 B2 | 4/2006 | Georgakos | |
| 7,038,296 B2 | 5/2006 | Laws | |
| 7,050,290 B2 | 5/2006 | Tang et al. | |
| 7,116,544 B1 | 10/2006 | Sutardja | |
| 7,154,734 B2 | 12/2006 | Schultz et al. | |
| 7,161,228 B1 | 1/2007 | Pettit | |
| 7,170,178 B2 | 1/2007 | Bely et al. | |
| 7,193,263 B2 | 3/2007 | Barth | |
| 7,195,971 B2 | 3/2007 | Bernstein et al. | |
| 7,202,548 B2 | 4/2007 | Lee | |
| 7,259,945 B2 | 8/2007 | Cleveland | |
| 7,259,956 B2 | 8/2007 | Fong et al. | |
| 7,274,085 B1 | 9/2007 | Hsu et al. | |
| 7,298,001 B1 | 11/2007 | Liu | |
| 7,439,570 B2 * | 10/2008 | Anthony | 257/309 |
| 7,485,914 B2 | 2/2009 | Huang et al. | |
| 7,564,675 B2 | 7/2009 | Chen et al. | |
| 7,663,233 B2 | 2/2010 | Lim | |
| 7,768,054 B2 | 8/2010 | Benetik | |
| 2003/0202331 A1* | 10/2003 | Jessie et al. | 361/764 |
| 2005/0077581 A1 | 4/2005 | Chang et al. | |
| 2005/0135042 A1 | 6/2005 | Chiu-Kit Fong et al. | |
| 2005/0161725 A1 | 7/2005 | Da Dalt | |
| 2006/0086965 A1* | 4/2006 | Sakaguchi et al. | 257/307 |
| 2006/0203424 A1 | 9/2006 | Chen et al. | |
| 2007/0181973 A1 | 8/2007 | Hung et al. | |
| 2007/0190760 A1 | 8/2007 | Coolbaugh et al. | |
| 2007/0278551 A1 | 12/2007 | Anthony | |
| 2007/0296013 A1 | 12/2007 | Chang et al. | |
| 2009/0057826 A1 | 3/2009 | Kim et al. | |

FOREIGN PATENT DOCUMENTS

| | | |
|---|---|---|
| DE | 100 46 910 A1 | 10/2001 |
| GB | 1 149 569 | 4/1969 |
| GB | 1 469 944 A | 4/1977 |
| JP | 57-106804 | 7/1982 |
| JP | 58-051552 | 3/1983 |
| JP | 59-91718 | 6/1984 |
| JP | 61-259560 A | 11/1986 |
| JP | 61-263251 A | 11/1986 |
| JP | 63-070550 | 3/1988 |
| JP | 01084616 A | 3/1989 |
| JP | 01096943 A | 4/1989 |
| JP | 01-313917 | 12/1989 |
| JP | 02231755 A | 9/1990 |
| JP | 02-268439 | 11/1990 |
| JP | 02-307275 | 12/1990 |
| JP | 03-008360 | 1/1991 |
| JP | 03-071612 | 3/1991 |
| JP | 04-268756 | 9/1992 |
| JP | 07-283076 | 10/1995 |
| WO | WO 03/090280 | 10/2003 |

OTHER PUBLICATIONS

Rhoads et al., "Planar tilings by polyominoes, polyhexes and polyiamonds", Journal of Computational and Applied Mathematics, Amsterdam, NL, vol. 174, No. 2, Feb. 15, 2005, pp. 329-353.

Amintoosi et al., "Using pattern matching for tiling and packing problems" European Journal of Operational Research, Amsterdam, NL, vol. 83, No. 3, Jul. 10, 2007, pp. 950-960.

Jacobsen, Jesper, Lykke "Tetromino tilings and the Tutte polynomial", Journal of Physics A: Mathematical and Theoretical, vol. 40, No. 7, Feb. 16, 2007. pp. 1439-1446.

U.S. Appl. No. 12/276,289, filed Nov. 21, 2008, Quinn, Patrick J., Xilinx, Inc. 2100 Logic Drive, San Jose, California.

U.S. Appl. No. 12/276,292, filed Nov. 21, 2008, Quinn, Patrick J., Xilinx, Inc. 2100 Logic Drive, San Jose, California.

U.S. Appl. No. 12/276,293, filed Nov. 21, 2008, Quinn, Patrick J., Xilinx, Inc. 2100 Logic Drive, San Jose, California.

U.S. Appl. No. 12/276,296, filed Nov. 21, 2008, Quinn, Patrick J., Xilinx, Inc. 2100 Logic Drive, San Jose, California.

U.S. Appl. No. 12/276,280, filed Nov. 21, 2008, Quinn, Patrick J., Xilinx, Inc. 2100 Logic Drive, San Jose, California.

Aparicio and Hajimiri, "Capacity Limits and Matching Properties of Integrated Capacitors", IEEE J. Solid-State circuits, vol. 37, No. 3, pp. 384-393, Mar. 2002.

Samavati, H. et al., "Fractal Capacitor", IEEE Journal of Solid-State Circuit, vol. 33, No. 12 pp. 2035-2041, Dec. 1998.

Chan et al., "Analysis of MMIC Structures Using an Efficient Iterative Approach", IEEE Transactions on Microwave Theory and Techniques, vol. 36, No. 1, Jan. 1988, pp. 96-105.

Imamura et al., "Bending-Comb capacitor with a Small Parasitic Inductance", 2002 Symposium on VLSI Circuits Digest of Technical Papers, IEEE 2002, Jun. 13-15, 2002, pp. 22-25.

Rajagopalan et al., "Optimization of Metal-Metal Comb-Capacitors for RF Applications", Wireless Design & Development, Mar. 4, 2001, pp. 1-4.

Sowlati et al., "High Density Capacitance Structures in Submicron CMOS for Low Power RF Applications", International Symposium on Low Power Electronics and Design, 2001, Aug. 6-7, 2001, pp. 243-246.

Wakayama et al., "A 30-MHz Low-Jitter High-Linearity CMOS Voltage-Controlled Oscillator", IEEE Journal of Solid-State Circuits, vol. sc-22, No. 6, Dec. 1987, pp. 1074-1081.

* cited by examiner

INTEGRATED CAPACITOR WITH TARTAN CROSS SECTION

RELATED APPLICATIONS

This patent application is being concurrently filed with commonly owned U.S. patent application entitled SHIELDING FOR INTEGRATED CAPACITORS by Patrick J. Quinn; and with commonly owned U.S. patent application entitled INTEGRATED CAPACITOR WITH INTERLINKED LATERAL FINS by Patrick J. Quinn; and with commonly owned U.S. patent application entitled INTEGRATED CAPACITOR WITH CABLED PLATES by Patrick J. Quinn; and with commonly owned U.S. patent application entitled INTEGRATED CAPACITOR WITH ARRAY OF CROSSES by Patrick J. Quinn; and with commonly owned U.S. patent application entitled INTEGRATED CAPACITOR WITH ALTERNATING LAYERED SEGMENTS by Jan L. de Jong et al., the disclosures of which are each hereby incorporated by reference in their entireties for all purposes.

FIELD OF THE INVENTION

The present invention relates to capacitors formed in integrated circuits ("ICs") commonly referred to as "integrated capacitors".

BACKGROUND

Methods of fabricating ICs typically include a front-end sequence of processing, in which various electrical devices such as transistors are formed in a semiconductor substrate, and a back-end sequence of processing, generally including forming alternating layers of dielectric material and patterned conductive material (typically metal) with conductive vias or other techniques being used to interconnect the metal layers to form a three-dimensional wiring structure that connects electrical devices to other electrical devices and to terminals of the IC.

Capacitors are used in IC systems for a variety of purposes. In many instances, it is desirable to incorporate (integrate) a capacitor in the IC chip. A simple approach is to form two conductive plates with an intervening dielectric; however, this consumes a relatively large area for the capacitance obtained. One technique for increasing the capacitance of a given area is to use multiple conductive plates, each conductive plate separated from the proximate plate(s) by dielectric. Further techniques use conducting strips, also called conductive lines, conductive fingers, or conductive traces that are alternately connected to the first and second capacitor terminals (nodes). Sidewall coupling between the conductive strips provides capacitance. Layers of conducting strips, either offset or arranged in vertical congruency, can be added to further increase the capacitance of an integrated capacitor structure.

One capacitor has a number of conductive strips in successive layers connected to the first node alternating with an equal number of conductive strips connected to the second node of the integrated capacitor. The conductive strips are offset a half cell on successive layers, so that a conductive strip connected to the first node has conductive strips connected to the second node above and on both sides of it. Providing an equal number of conductive strips in a layer for each node balances the coupling of each node to the substrate, which is desirable in some applications, but undesirable in others, such as switching applications where it is desirable to have less coupling at one node. In order to reduce coupling to the substrate, a thick layer of silicon dioxide is used between the substrate and the first layer of conductive strips. This may be difficult to integrate in a standard CMOS fabrication sequence, and might require additional steps to be added to the standard process flow. The overlapping parallel conductive strips are connected at their ends using buss strips that consume additional surface area.

Another approach to providing an integrated capacitor is to have conductive strips in a layer connected to alternate nodes of the capacitor with overlapping conductive strips connected to the same node. This forms essentially a curtain of conductive strips and interconnecting vias connected to the first node of the capacitor with adjacent curtains of conductive strips and interconnecting vias connected to the second node. Overlapping conductive strips connected to the same node avoids the lost surface area associated with buss strips; however, inter-layer capacitance is reduced because the upper strip is connected to the same node as the lower strip. This effect is somewhat obviated because, as critical dimensions shrink, inter-strip capacitance becomes more dominant than inter-layer capacitance. In other words, the dielectric layer separation between successive metal layers becomes increasingly greater than the dielectric separation between conductive strips with decreasing critical dimension.

Thus, integrated capacitors overcoming the disadvantages of prior art are desired. It is further generally desired that integrated capacitors have high capacitance per unit area, low loss (resistance), and low self-inductance, which improves high-frequency applications by increasing self-resonant frequency and the quality of capacitor circuits. In some applications, it is further desirable to shield integrated capacitors from electrical noise.

SUMMARY

A capacitor in an IC has a first layer of conductive strips extending along a first direction. A first plurality of conductive strips in the first layer forms a first portion of a first node of the capacitor and alternates with a second plurality of conductive strips forming a first portion of a second node of the capacitor. A plate layer adjacent to the first layer has a third plurality of conductive strips forming a second portion of the first node. The strips in the plate layer extend along a second direction orthogonal to the first direction. A first via electrically connects a first conductive strip in the first plurality of conductive strips in the first layer to a second conductive strip in the plate layer.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1:
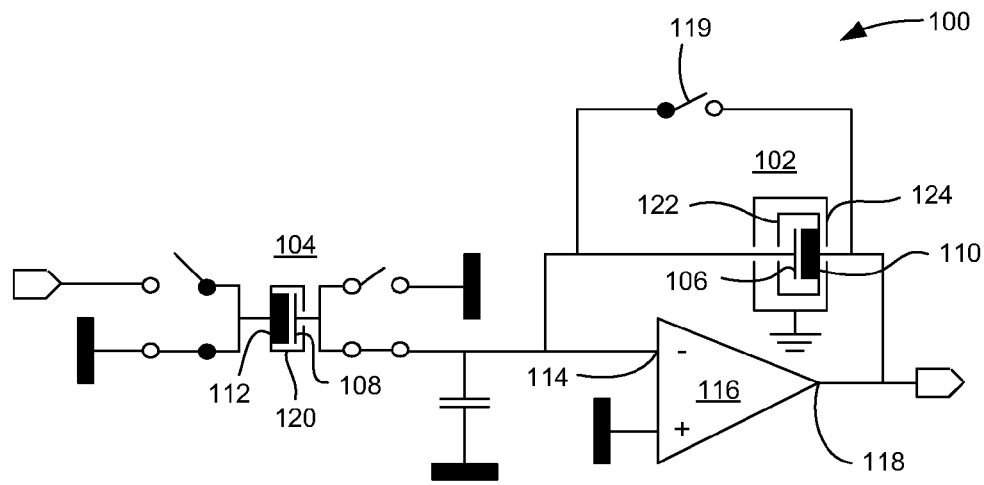
FIG. 1 is a circuit diagram of a circuit using capacitors according to embodiments of the invention.

FIG. 1 is a circuit diagram of a circuit 100 using capacitors 102, 104 according to embodiments of the invention. The top node 108 of capacitor 104 is switchable to be connected to or disconnected from a high-impedance input 114 of amplifier 116. The bottom node 112 is connected to a switch. The top node 106 of the feedback capacitor 102 is also connected to the high-impedance input 114 of the amplifier 116 while the bottom node 110 is connected to output 118 of the amplifier 116. The feedback capacitor 102 is switchably shorted by closing switch 119. The coupling capacitor 104 has a top node 108 shielded by an optional bottom node shield 120 that essentially surrounds the top node 108 with conductive structures electrically connected to the bottom node and reduces parasitic capacitive coupling of the top node 108 to other nodes of the circuit 100. Connection to the top node 108 is made through a gap in the bottom node shield 120. Although the bottom node shield is shown as being contiguous, in some embodiments the bottom node shield is made up of several conductive elements, such as metal filaments, metal vias, and polysilicon or silicide plates or strips, to form a conductive cage around the top node, shielding the top node from electronic noise and from coupling to other nodes of the IC. In some embodiments, the bottom node shield contributes to the overall capacitance of the integrated capacitor by coupling to the top node.

The feedback capacitor 102 has a top node 110 shielded by an optional bottom node shield 122, and by an optional reference shield 124. The reference shield 124 is connected to a relatively stable reference voltage present in the IC, such as analog ground, digital ground, or $V_{DD}$. The reference shield 124 essentially surrounds the bottom node shield 120 and shields the bottom node from substantially coupling to more than one voltage reference (e.g., the bottom node couples to $V_{DD}$ or ground, but not both). In other embodiments, a reference shield partially surrounds a bottom node shield. The reference shield has a gap allowing electrical contact to be made to the bottom node, as described above.

The terms "top" node and "bottom" node do not necessarily relate to the physical orientation of the nodes relative to the IC or other structure, but are used as terms of convenience. In some circuit applications, the top node of a capacitor indicates the node that is connected to a high-impedance or high-gain port of an amplifier or other device. In a system-on-chip ("SoC"), the accuracy on an analog-to-digital converter ("ADC") is dependent on the ratio of the parasitic capacitance at the top node ($C_{top}$) to all other nodes except the bottom node and the capacitance ($C_{sig}$) that is the useful floating signal capacitance between both nodes. It is desirable to shield the top plate from ground currents or voltage supply fluctuations so that $C_{top}$ remains low. Using the bottom node to essentially surround the top node isolates the top node from coupling with other nodes in the circuit by essentially forming a portion of Faraday shell around the top node, and in some embodiments, distancing the top node from other conductive elements in the IC. It is understood by those of skill in the art that electrical connection to the top node is made through the bottom node shield, and therefore the bottom node shield does not completely surround the top node.

In some embodiments, some sides of the top node are left unshielded. For example, an end of the top node that is physically distant from other nodes might be left unshielded. In other embodiments, integrated capacitors are used as design cells, and adjacent integrated capacitors are connected in parallel to obtain a higher total capacitance. In some embodiments, the portions of the bottom node shield of adjacent commonly-connected integrated capacitors are omitted, allowing higher packing density. In yet other applications, such as high-frequency analog circuits in MGTs (multi-gigabit transceivers) of an FPGA (field programmable gate array), a node shield is omitted to maintain balance between the plates of the capacitor. Capacitors are generally useful in a wide variety of integrated circuits and in a wide variety of applications. For instance, one or more capacitors may be useful for a switched capacitor network, such as in an analog-to-digital converter, or as a decoupling or filtering capacitor for AC signaling (e.g., in an MGT). In general, the capacitor structure described herein may be useful in any application requiring capacitance.

Complex ICs, such as programmable logic devices, often have several patterned metal layers separated by layers of dielectric material formed over a semiconductor substrate that are used for wiring connections and other functions commonly called the "backend" of the IC. Some embodiments of the invention are adaptable to existing CMOS process sequences by using masks that form the desired patterns in the appropriate metal layers and vias through the inter-metal dielectric ("IMD") layers or inter-layer dielectric ("ILD") in the backend of the IC. The vias are formed using any of several known techniques, such as contact plug, damascene, or dual damascene techniques. Similarly, the conductive strips are formed using any of several known techniques, such as thin-film metal etch, thin-film metal lift-off, damascene, and dual damascene techniques. In some embodiments, one of the conductive layers is a polysilicon or silicide layer. In a further embodiment, a conductive well in the semiconductor substrate forms a portion of a capacitor plate or a shield.

Figure 2A:
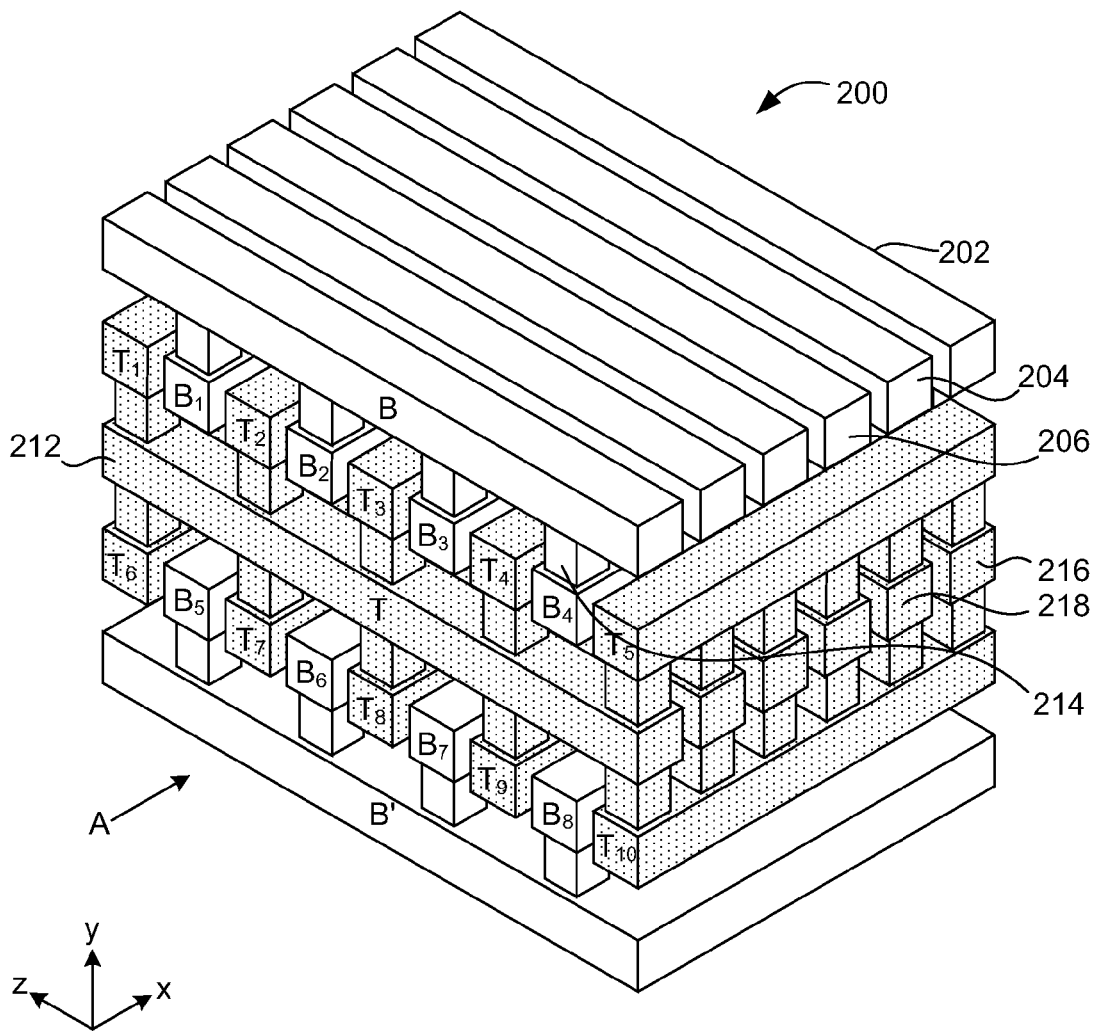
FIG. 2A is an isometric view of a portion of an integrated capacitor according to an embodiment of the present invention.

FIG. 2A is an isometric view of a portion 200 of an integrated capacitor according to an embodiment of the present invention. A bottom plate conductive matrix 202 includes a first bottom plate layer B made up of a first plurality of conductive strips 204, 206 and a second bottom plate layer B' made up of a sheet of polysilicon or silicide, in what is commonly called a "poly" layer, all connected to the bottom node of the integrated capacitor. Alternatively, the second bottom plate layer is formed in a metal layer and is made up of strips, similar to the first bottom plate layer. In yet another embodiment, the bottom plate layers are omitted to maintain good balance between the top and bottom conductive matrices for use in high-frequency applications. Similarly, using only metal layers for the node conductive matrices reduces loss compared to using a poly layer. Utilizing upper metal layers, and not utilizing the substrate and poly layer(s) in the capacitor design, also avoids substrate noise, which is desirable in some applications. Note that certain aspects of the capacitor are not shown in the partial view of FIG. 2A to avoid obscuring the internal structure.

A plate layer is a layer in which the strips in a layer are adjacent to each other and connected to a node to essentially form a conductive plate or a layer of polysilicon or silicide. The bottom node in this embodiment is the capacitor node that is less susceptible to electronic noise than the top node when the capacitor is used in a particular circuit application. A top plate conductive matrix 212 is overlain by the first bottom plate layer B and underlain by the second bottom plate layer B', which forms a partial Faraday shield around the core capacitor formed by the top plate layer T and the transverse interleaved layers above and below the top plate layer T. The strips in the top plate layer T are connected to the top node and are adjacent (at least on one side) to a strip also connected to the top node. The optional bottom plate shield reduces noise coupled to the top plate conductive matrix and increases specific capacitance of the integrated capacitor by capacitively coupling to the top plate conductive matrix.

The first bottom plate layer is made up of strips, rather than a continuous sheet, because of design layout rules familiar to those of skill in the art of IC fabrication, and forms a pattern reminiscent of a tartan plaid fabric with the other metal layers. Generally, each metal layer has minimum and maximum metal line widths and minimum separations. Polysilicon and silicide layers typically have different design and process rules than patterned metal layers, which allows forming the bottom plate layer as a contiguous sheet of poly when the poly layer is used. Similarly, large conductive areas can be formed in the semiconductor substrate (e.g., an N-well or a P-well) to form a continuous conductive sheet. In an alternative embodiment, the second bottom plate layer is formed in a conductive well of the substrate. The conductive well is separated from the poly layer by a relatively thin dielectric layer, providing good electrical performance even though the N-well is generally less conductive than a metal layer or poly layer. Using a conductive well to form part of a shield is further desirable because a moat can be formed around the portion of the substrate in which the N-well or P-well is formed, which electrically isolates that portion of the substrate from stray currents in other portions of the substrate and provides a low-noise element. Use of a conductive well in a shield is also desirable because the well is surrounded in a fairly symmetrical fashion by metal, leading to symmetrical current flow through the well portion of the shield.

The conductive strips 204, 206 in the upper bottom plate layer B are electrically connected through vias (not shown, see, e.g., via 214) to transverse (i.e., generally orthogonal) conductive strips (e.g., B4) in the lower layer so that interconnection between conductive strips 204, 206 in the metal layer of the first bottom plate layer B is not necessary. Alternatively, conductive cross members (cross-connects between strips in the metal layer) are optionally included in the first bottom plate layer to connect conductive strips in the layer, which improves shielding.

Similarly, a top plate layer T is made up of a plurality of conductive strips 216, 218 connected to the top node of the integrated capacitor. The conductive strips in the top plate layer T are transverse to conductive strips T1, T2, T3, T4, T5 above the top plate layer T and transverse to conductive strips T6, T7, T8, T9, T10 below the top plate layer, and conductive strips in the top plate layer T are electrically connected to each other through vias and transverse conductive strips above and below the top plate layer T. In other words, the conductive strips in the top plate layer T extend along the X-direction and the conductive strips in the interleaved layers above and below the top plate layer T extend along the Z-direction.

In some embodiments, the conductive strips (e.g. T1, B1) are made from a minimum-width metal line and are commonly referred to as "conductive filaments" or "metal filaments" and provide high line densities and high lateral capacitance. Lateral capacitance between conductive strips in the plate layers does not contribute to the specific capacitance of the integrated capacitor because the metal strips are connected to the same node, and conductive strips in the plate layers are often wider than minimum metal line width.

The plate layers B, T, B' do not have alternating conductive strips, but rather all the conductive strips in these layers are connected to either the top node or the bottom node of the integrated capacitor. The configuration of a capacitor according to FIG. 2A provides bottom plates B, B' that shield the conductive elements of the top plate because they are embedded between the first and second bottom plate layers in the IC stack. Conductive curtains (see, FIG. 2B, ref. nums. 236, 238) on the right and left sides of the top plate conductive matrix are formed of vias and metal strips extending along the Z-direction (orthogonal to the plane of the paper) between the first bottom plate B and the second bottom plate B' and extend along a third direction (e.g., the Z direction as illustrated in FIG. 2A) to form essentially a conductive plane (in the plane defined by the Y and Z axes). The bottom plate conductive matrix of the integrated capacitor loosely surrounds the top plate conductive matrix of the integrated capacitor so that the top plate couples with the bottom plate on the top, bottom, right side, and left side. In a further embodiment, additional conductive curtains are optionally added in the plane defined by the X and Z axes to cover (shield) the ends of the top node conductive elements in these planes.

Figure 2B:
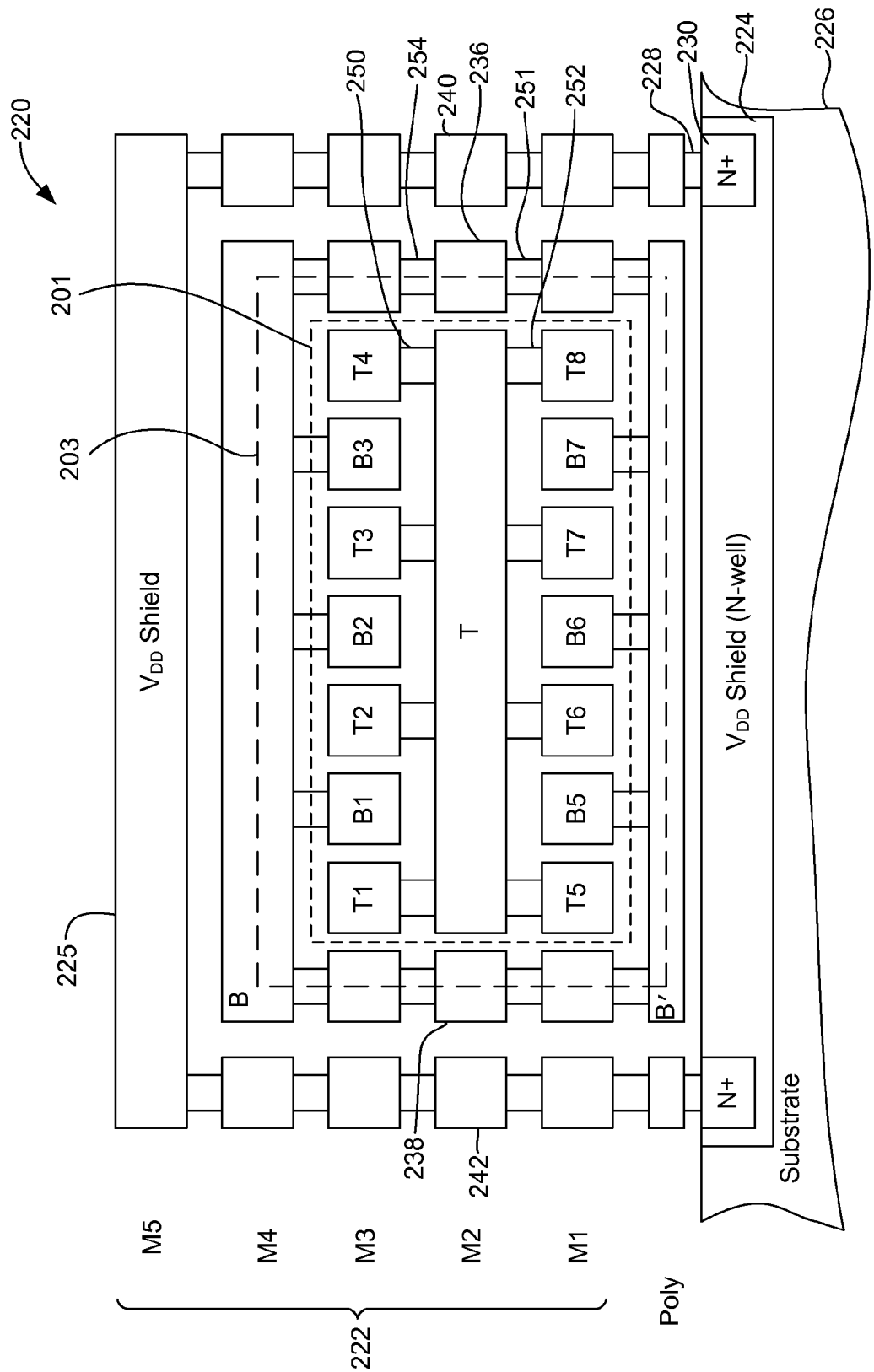
FIG. 2B is a side view of the integrated capacitor of FIG. 2A.

FIG. 2B is a side view of an integrated capacitor 220 in accordance with FIG. 2A. The side view is taken along the direction of the arrow A in FIG. 2A. The integrated capacitor has a core capacitor portion 201 and a shield capacitor portion 203. The shield capacitor portion 203 is basically a bottom node shield that has a first shield layer B formed in the fifth metal layer M5 of a backend stack 222 of an IC that includes metal layers M1, M2, M3, M4, M5 and intervening dielectric layers that have vias (e.g., via 251) extending through the dielectric layers to connect metal layers. The dielectric layers are not shown with hatching for clarity of illustration, as they are well understood by those of skill in the art of IC processing. Other embodiments use only metal layers for the capacitor's node matrices, moving the capacitor up in the stack, or reducing the number of layers in the capacitor. Some ICs utilizing integrated capacitors according to embodiments have up to eleven metal layers; however, designs are often implemented using only up to the M5 or M6 layer.

Integrated capacitors according to alternative embodiments include additional metal layers. The integrated capacitor includes an optional reference shield, which in this embodiment is a reference shield connected to $V_{DD}$. The reference shield includes a shield plate 224 made up of a conductive well (Nwell), formed in the semiconductor substrate 226 of the IC, a top shield plate 225 formed in the M5 metal layer, and conductive curtains 240, 242.

A polishing step often follows deposition and patterning of a metal layer to provide a flat, smooth surface for forming and patterning the next metal layer. Stacking several layers of conductive strips directly over each other might result in an undulating surface in the upper layers due to the cumulative effects of having multiple layers of metal strips directly over several other layers of metal strips. The intervening top plate layer T, with strips transverse to the strips in the metal layers directly above and below the plate layer, mitigates the effects of having the conductive strips in the M3 layer directly over the conductive strips in the M1 layer, for example.

The shield capacitor portion 203 forms a conductive sheath around the core capacitor portion 201, which has interleaved top and bottom node conductive filaments that provide high specific capacitance in the M1 and M3 metal layers. The shield capacitor portion adds additional capacitance by coupling to the top node conductive elements. In a typical embodiment, each layer of interleaved filaments will have hundreds of filaments and the lateral coupling between the filaments is a significant portion of the total capacitance of the integrated capacitor.

The second bottom plate layer B' is formed in the poly layer of the IC. In an alternative embodiment, the second bottom plate layer is formed as strips in a metal layer, such as M1 or M2, in a backend stack that has additional metal layers. Utilizing the poly layer for the second bottom plate layer allows a shielded integrated capacitor (without the optional $V_{DD}$ shield) to be formed in a four-metal-layer IC. In an alternative embodiment, a conductive well formed in the semiconductor substrate is used as the second bottom plate layer, allowing an embodiment to be fabricated in three metal layers of an IC, or allowing additional metal layers for increasing the specific capacitance of a capacitor of a given area. The dielectric layer above the substrate and poly layer (not separately shown) is commonly called an inter-layer dielectric ("ILD"), and the conductive element 228 connecting the poly layer to the N+ conductive area 230 of the substrate is commonly called a contact, as opposed to a via. A gate dielectric layer (not separately shown) between the poly and the N-well is typically much thinner than the ILD layer.

FIG. 2B is not drawn to scale. Generally, the thicknesses of the IMD and ILD layers are greater than the spacing between the interleaved conductive strips (e.g., T1 and B1) in the interleaved layers M3 and M1. In an exemplary embodiment, the ILD layer is about 300 nm thick silicon oxide, while the dielectric layer between the poly layer and M1 layer is about 100 nm thick and the higher layers are about 250 nm. The minimum separation between metal traces in a layer is typically much smaller, thus the sidewall capacitance between T1 and B1, for example, is greater than the vertical capacitance between T1 and B. Similarly, the sidewall capacitance between the ends of the top plate conductive matrix (e.g., T1, T4, T5, T8, and both ends of T) and the conductive curtains 236, 238; and the end vias 250, 252 and curtain vias 254, 251 (and corresponding vias on other sides) provide additional capacitance that compensates for the lack of interleaving in the M4, M2 and poly layers. As node technology shrinks and the minimum dimension between conductive strips in the interleaved layers decreases, the relative contribution of sidewall capacitance between interleaved metal strips and vias to the overall capacitance increases.

The optional reference shield includes a first shield layer 225 and the shield plate 224 formed in the N-well that are connected through a series of vias, metal, poly, and contacts. The vias, metal, poly, and contacts form a first shield curtain and a second shield curtain that are basically the right and left vertical portions of the reference shield. In a further embodiment, third and fourth conductive curtains of the bottom plate conductive matrix enclose the as-viewed front and back planes of the bottom node shield and core capacitor. These features are not shown for purposes of clarity of illustration, as they would be understood by one of ordinary skill in the art in light of the conductive and shield curtains illustrated in side view.

The reference shield is connected to a stable voltage reference, such as $V_{DD}$ or ground, to reduce coupling of the bottom node to more than one voltage node. For example, the bottom node matrix couples essentially only to the top node and to $V_{DD}$. Negligible coupling of the other nodes of the IC to the bottom node occurs. Similarly, if the shield were connected to ground instead of $V_{DD}$, the bottom node would only couple to the top node and ground.

It is generally undesirable for the bottom node to couple to $V_{DD}$ and ground simultaneously because the bottom node would then act as a bridge between ground and $V_{DD}$, and could couple undesirable switching currents between the two nodes, for example. However, in some embodiments, limited coupling to both $V_{DD}$ and ground is acceptable, particularly if coupling of the bottom node shield to a reference shield is limited to conductive elements connected to an isolated portion of the substrate, or if the ground node is an analog ground node that is reasonably well isolated from a digital ground node.

A gap or similar feature (not shown, see FIG. 1) is provided in the shield to allow circuit connection to the bottom node conductive matrix, and a second gap or similar feature is provided in the shield, and a third gap or similar feature is provided in the bottom plate conductive matrix to allow connection to the top node conductive matrix. In embodiments omitting front and back conductive curtains or shield curtains, electrical connections to the conductive matrices can be brought out in the directions orthogonal to the plane of the illustration sheet, for example. Bottom node shielding can also be brought out along the top node connection to a switch, for example, to further shield the top node.

Figure 3:
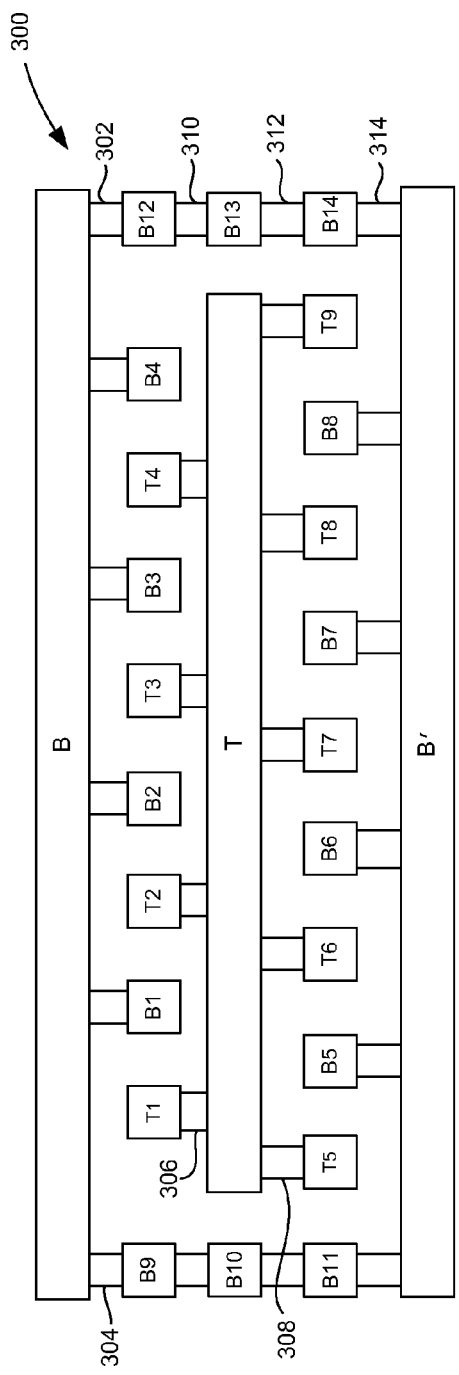
FIG. 3 is a side view of a portion of an integrated capacitor according to an alternative embodiment.

FIG. 3 is a side view of a portion 300 of an integrated capacitor according to an alternative embodiment. The conductive strips are not aligned between conductive layers (compare, e.g., T1 and T5 of FIG. 3 with T1 and T5 of FIG. 2B). Offsetting conductive strips between layers provides manufacturability advantage in some fabrication sequences. A polishing step often follows metal deposition and patterning to provide a flat, smooth surface for the next metal layer formation and patterning. Stacking several layers of conductive strips directly over each other might result in an undulating surface in the upper layers due to the cumulative effects of having multiple layers of metal strips directly over several other layers of metal strips.

A first bottom plate layer B is connected to a second bottom plate layer B' through conductive curtains 302, 304. A top plate layer T is connected to conductive strips T1, T5 through vias 306, 308. Conductive strips T1, T2, T3, T4 connected to the top node of the integrated capacitor are interleaved with conductive strips B1, B2, B3, B4 connected to the bottom node of the integrated capacitor to form a first interleaved layer between the first bottom plate layer B and the top plate layer T. Conductive strips T5, T6, T7, T8, T9 are connected to the top node of the integrated capacitor and are interleaved with conductive strips B5, B6, B7, B8 connected to the bottom node of the integrated capacitor to form a second interleaved layer between the top plate layer T and the second bottom plate layer B'. Dielectric material between the conductive elements is present but not separately shown for clarity of illustration of the conductive matrices of the integrated capacitor.

Conductive curtain 302 has conductive strips B12, B13, B14 extending along the direction orthogonal to the plane of the sheet of illustration interconnected with vias 310, 312, 314 to the second bottom plate B'.

Figure 4:
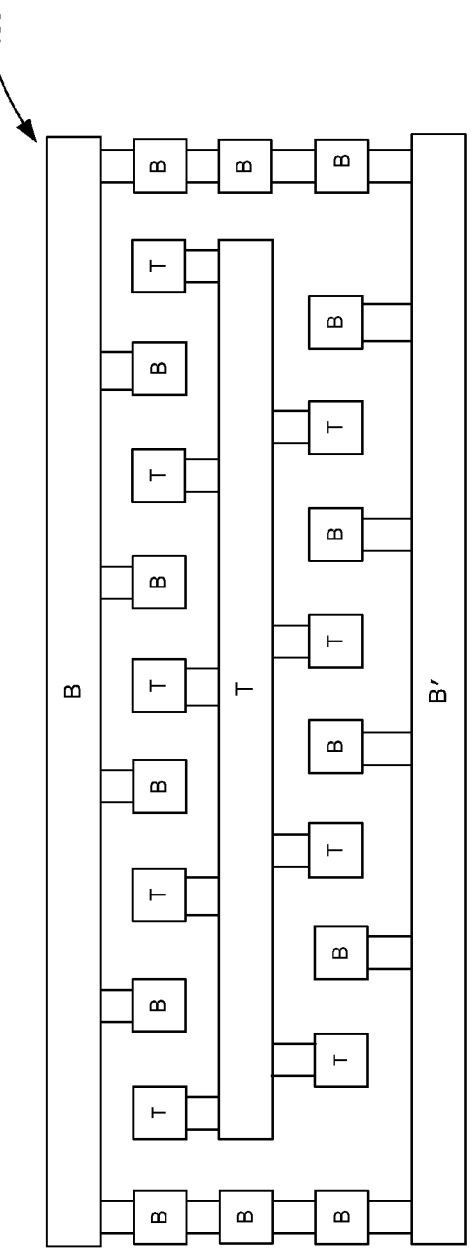
FIG. 4 is side view of a portion of an integrated capacitor according to yet another alternative embodiment.

FIG. 4 is side view of a portion 400 of an integrated capacitor according to yet another alternative embodiment. FIG. 4 shows an alternative embodiment where metal strips in one layer are not directly over the metal strips in a lower patterned metal layer.

Note that the types of and number of layers described are merely examples, and in some embodiments other suitable layers may be used, and any number of layers may be used. For example, the layers used may depend on the types and numbers of layers that are available in the manufacturing process, and other arrangements will be apparent to those of skill in the art. In general, any suitable layer, and an arbitrary number of layers may be used in accordance with embodiments of the present invention.

Figure 5:
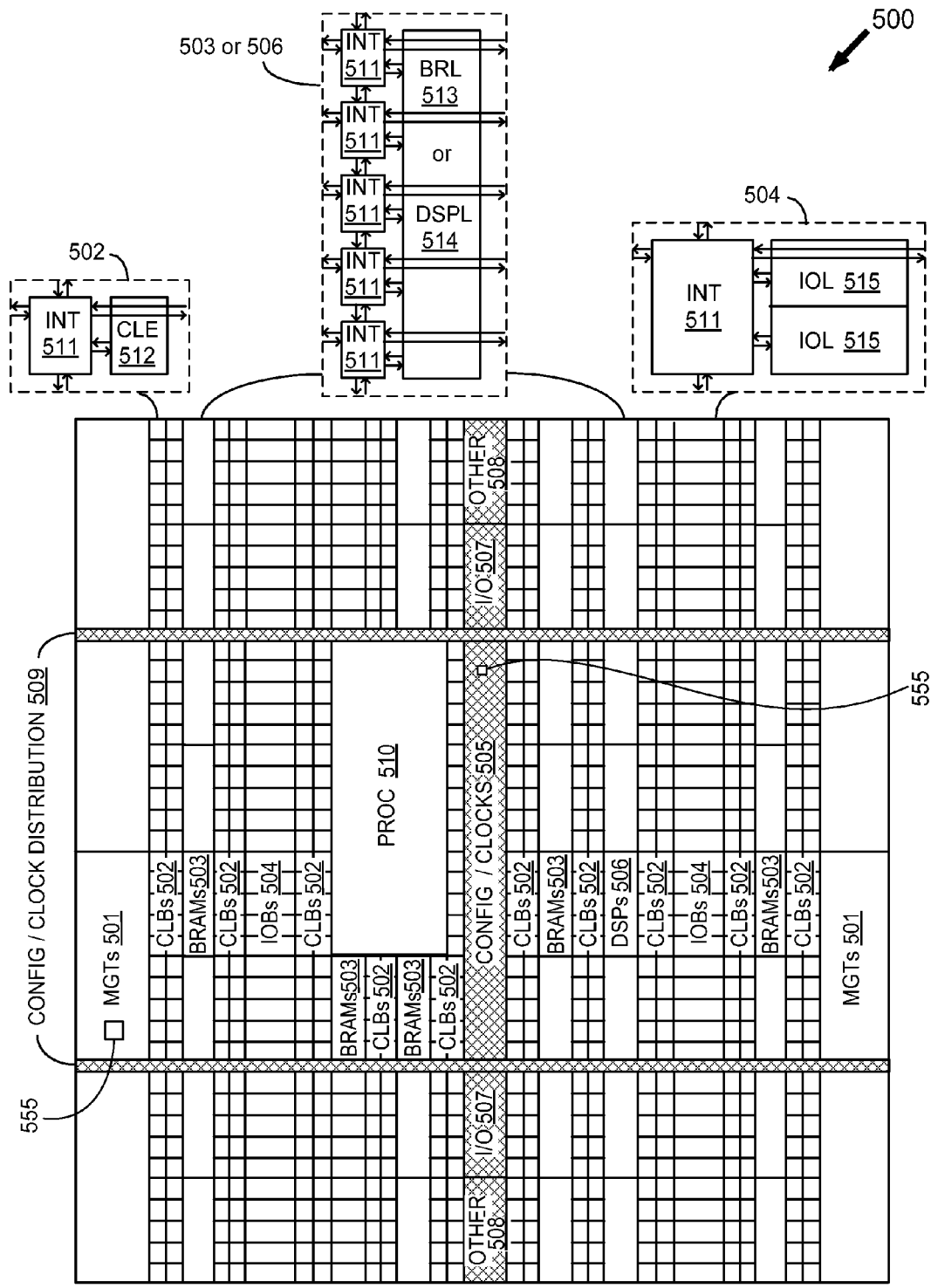
FIG. 5 is a plan view of an FPGA incorporating an integrated capacitor according to an embodiment.

FIG. 5 is a plan view of an FPGA 500 semiconductor device incorporating an integrated capacitor according to an embodiment. The FPGA 500 includes CMOS portions in several of the functional blocks, such as in RAM and logic, and is fabricated using a CMOS fabrication process. One or more integrated capacitors 555 according to one or more embodiments of the invention are incorporated in any of several functional blocks of the FPGA, such as a clock circuit 505, a multi-gigabit transceivers 501, or other functional block; within many functional blocks; or within a physical section or segment of the FPGA 500. Integrated capacitors 555 are particularly desirable in applications where one or both terminals of the capacitor are switched, and embodiments including top plate shielding are further desirable in applications wherein the top plate is connected to or switched to a high-impedance or high-gain node of a circuit in the FPGA 500. In a particular embodiment, an integrated capacitor according to an embodiment is formed in an analog section of the FPGA, rather than a digital section of the FPGA, to avoid electrical noise associated with digital switching currents.

The FPGA architecture includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An 10B 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A capacitor in an integrated circuit ("IC") comprising:
a first layer of conductive strips extending along a first direction including a first plurality of conductive strips forming a first portion of a first node of the capacitor alternating with a second plurality of conductive strips forming a first portion of a second node of the capacitor;
a plate layer adjacent to the first layer, the plate layer including a third plurality of conductive strips forming a second portion of the first node, each strip in the third plurality of conductive strips being next to another strip in the third plurality of conductive strips in the plate layer and extending along a second direction orthogonal to the first direction; and
a first via electrically connecting a first conductive strip in the first plurality of conductive strips in the first layer to a second conductive strip in the plate layer.

2. The capacitor of claim 1 further comprising
a second plate layer of conductive strips extending along the second direction, the first layer of conductive strips being disposed between the plate layer and the second plate layer, the second plate layer including a fourth plurality of conductive strips forming a second portion of the second node, wherein each strip in the fourth plurality of conductive strips is next to another strip in the fourth plurality of conductive strips in the second plate layer; and
a second via electrically connecting a third conductive strip in the second plurality of conductive strips in the first layer to a fourth conductive strip in the second plate layer.

3. The capacitor of claim 2 further comprising
a third via electrically connecting the fourth conductive strip in the second plate layer to a fifth conductive strip in the second plurality of conductive strips in the first layer.

4. The capacitor of claim 1 further comprising
a second via electrically connecting the second conductive strip in the plate layer to a third conductive strip in the first plurality of conductive strips in the first layer.

5. The capacitor of claim 4 further comprising
a third via electrically connecting a fourth conductive strip in the third plurality of conductive strips in the plate layer to the first conductive strip in the first plurality of conductive strips in the first layer.

6. The capacitor of claim 1 further comprising a second layer of conductive strips, the plate layer being disposed between the first layer of conductive strips and the second layer of conductive strips, the second layer of conductive strips including a fourth plurality of conductive strips forming a third portion of the first node alternating with a fifth plurality of conductive strips forming a second portion of the second node, the conductive strips in the second layer extending along the first direction.

7. The capacitor of claim 6 further comprising a second via electrically connecting the second conductive strip in the plate layer to a third conductive strip in the fourth plurality of conductive strips in the second layer.

8. The capacitor of claim 7 further comprising
   a second plate layer of conductive strips extending along the second direction, the first layer of conductive strips being disposed between the plate layer and the second plate layer, the second plate layer including a fifth plurality of conductive strips forming a third portion of the second node and, wherein each strip in the fourth plurality of conductive strips is next to another strip in the fourth plurality of conductive strips in the second plate layer;
   a third via electrically connecting a fourth conductive strip in the second plurality of conductive strips in the first layer to a fifth conductive strip in the second plate layer;
   a third plate layer, the second layer of conductive strips being disposed between the plate layer and the third plate layer; and
   a fourth via electrically connecting a sixth conductive strip in the fifth plurality of conductive strips in the second layer to the third plate layer.

9. The capacitor of claim 8 wherein the third plate layer is a polysilicon or silicide layer.

10. The capacitor of claim 8 further comprising a first conductive curtain extending from the second plate layer to the third plate layer, and a second conductive curtain extending from the second plate layer to the third plate layer, the first conductive curtain and the second conductive curtain forming a fourth portion of the second node, the first conductive curtain, second plate layer, second conductive curtain, and third plate layer forming a node shield surrounding the plate layer, the first plurality of conductive strips, and the fourth plurality of conductive strips.

11. The capacitor of claim 10 further comprising a reference shield surrounding the node shield.

12. The capacitor of claim 11 wherein the reference shield includes a reference shield plate formed in a semiconductor substrate of the IC.

13. The capacitor of claim 12 wherein reference shield plate comprises an N-well.

14. The capacitor of claim 13 further including a second reference shield plate formed in a metal layer of the IC.

15. The capacitor of claim 14 wherein the metal layer is a top metal layer of the integrated circuit.

16. The capacitor of claim 14 wherein the second reference shield plate is formed in an analog ground layer of the integrated circuit.

17. The capacitor of claim 14 wherein the capacitor is located in an analog section of the integrated circuit.

18. The capacitor of claim 1 wherein the capacitor is located in an analog-to-digital converter.

19. The capacitor of claim 1 wherein the capacitor is located in a transceiver.

20. The capacitor of claim 1 wherein the integrated circuit is a field programmable gate array.

* * * * *